May 7, 1968 M. FISCHMAN 3,382,458

VARIABLE FREQUENCY SINE WAVE OSCILLATOR

Filed Feb. 2, 1967 2 Sheets-Sheet 1

INVENTOR.
MARTIN FISCHMAN

BY R. J. Frank
ATTORNEY.

May 7, 1968 M. FISCHMAN 3,382,458

VARIABLE FREQUENCY SINE WAVE OSCILLATOR

Filed Feb. 2, 1967 2 Sheets-Sheet 2

INVENTOR.
MARTIN FISCHMAN

BY R. J. Frank
ATTORNEY.

United States Patent Office 3,382,458
Patented May 7, 1968

3,382,458
VARIABLE FREQUENCY SINE WAVE OSCILLATOR

Martin Fischman, Wantagh, N.Y., assignor to General Telephone & Electronics Laboratories, Incorporated, a corporation of Delaware
Filed Feb. 2, 1967, Ser. No. 613,463
8 Claims. (Cl. 331—113)

ABSTRACT OF THE DISCLOSURE

A sine wave oscillator is disclosed in which the frequency is controlled by providing a variable phase shift in the oscillator feedback circuit. The variable phase shift is obtained by changing the symmetry of a square wave feedback signal and thereby varying the phase of the fundamental frequency component of the square wave. The change in the phase of the fundamental component causes the oscillator frequency to adjust to a new frequency in accordance with the frequency-phase relation of the oscillator tuned circuit.

*Background of the invention*

This invention relates to a sine wave oscillator containing variable phase shift means in the feedback path and, more particularly, to an oscillator in which the symmetry of a square wave feedback signal is varied to effect frequency control.

The general method of controlling the frequency of a sine wave oscillator is to control the reactance of the oscillator tuned circuit. In one type of oscillator, a quadrature current is caused to flow through an inductance-capacitance (LC) circuit under the control of a variable gain amplifier. By electronically varying the amplifier gain, the amount of quadrature current is varied and the frequency of oscillation changes accordingly. This type of oscillator is gain sensitive in that the frequency control relies on the stability and linearity of the amplifier characteristics. A second type of variable frequency oscillator employs a variable reactance device, such as a reverse-biased diode or a variable inductor, in the oscillator tuned circuit. This type of circuit is typically a narrow band oscillator due to lack of commercially available wideband variable reactances. In addition, an analog signal is used to vary the reactance and, therefore, the circuit is amplitude and gain sensitive. The amplitude and gain sensitivity of both the aforementioned variable frequency oscillators tend to result in frequency instability during operation.

*Summary of the invention*

The present invention is directed to a variable frequency sine wave oscillator in which the symmetry of a square wave feedback signal is varied to effect frequency control. The symmetry of the square wave feedback signal is controlled by a variable timing circuit contained in the feedback path of the oscillator. The timing circuit effects a change in symmetry by adjustably varying the occurrence of the transition between the different signal levels of the square wave. Since timing circuits are essentially insensitive to variations in the gain of the active devices employed therein, oscillators constructed in accordance with the present invention possess good frequency stability.

The present oscillator includes a series tuned circuit having first and second terminals. When the tuned circuit is oscillating at its resonant frequency, the tuned circuit current is in phas with the voltage appearing thereacross. The second terminal of the tuned circuit is coupled to the input terminal of a limiting amplifier. The limiting amplifier is responsive to the tuned circuit current and is characterized by a binary output waveform, i.e., the output varies between two levels, one of which is typically zero. The period of the output signal of the limiting amplifier is determined by the period of oscillation of the tuned circuit. Since the output of the tuned circuit is sinusoidal and, therefore, has equal duration half-cycles, the output of the limiting amplifier is a symmetrical square wave. As defined herein, a symmetrical square wave is characterized by having equal intervals at the different signal levels.

The output terminal of the limiting amplifier is coupled to the first terminal of a variable timing circuit. In addition means are provided for coupling the second terminal of the timing circuit to the first terminal of the tuned circuit. The variable timing circuit is operative to change the symmetry of the square wave applied to its first terminal and, as a result, alter the frequency of oscillation of the tuned circuit. In the case where a symmetrical square wave is unchanged by the timing circuit and fed back to the tuned circuit, the fundamental frequency component of the square wave is in phase with the current in the tuned circuit. Thus, the frequency of oscillation of the tuned circuit remains constant.

When the symmetry of the square wave is altered, the phase of the fundamental component is shifted. This phase shifted signal when fed back to the tuned circuit causes the oscillator frequency to change to a new frequency. The relationship between frequency and phase of a tuned circuit is shown by the resonance curve for series tuned circuits.

The variable timing circuit increases the interval during which the square wave is at one level and decreases the interval during which it is at the other level. In one embodiment of the invention, the variable timing circuit comprises a variable duration pulse generator, for example a monostable multivibrator which is triggered into its first state by the output signal of the limiting amplifier. When triggered, the pulse generator output is at a first voltage level. The output of the pulse generator remains at this level for an interval determined by a variable circuit parameter. At the end of this interval, the pulse generator returns to its quiescent or second state and its output is at a second voltage level. The pulse generator remains in its second state until it is again triggered by the output of the limiting amplifier. By adjusting the time constant of the pulse generator, the phase of the fundamental component of the square wave fed back to the tuned circuit may be varied.

The phase shift in the present oscillator is provided in effect, by controlling the duration of a binary signal with a timing circuit. As a result, the variation in the frequency of the tuned circuit is essentially independent of the variation in gain of any active devices. Further features and advantages of the invention will become more readily apparent from the following detailed description of a specific embodiment when taken in conjunction with the accompanying drawings.

*A brief description of the drawings*

*Description of the preferred embodiment*

Figure 1:
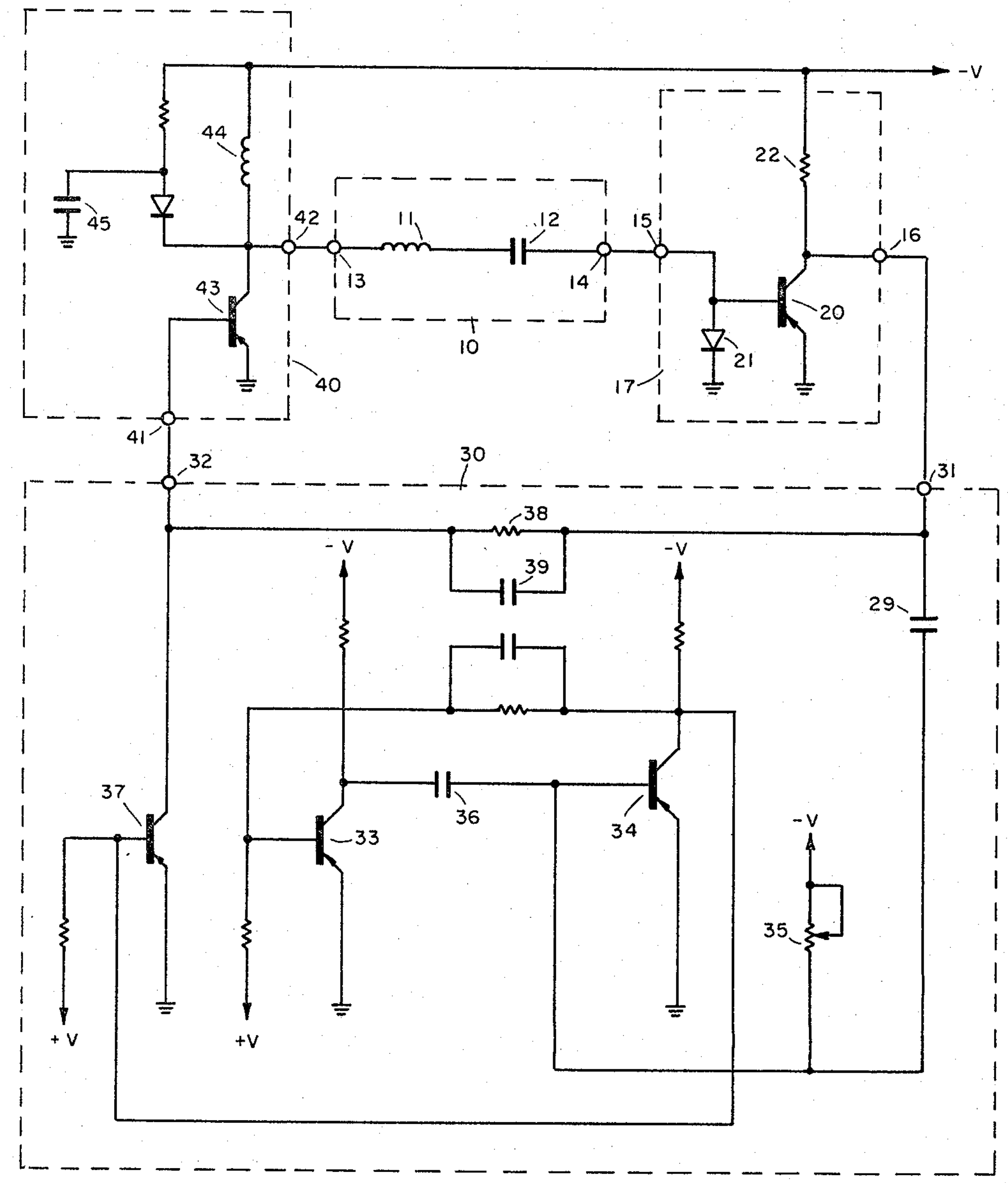
FIG. 1 is a circuit diagram of one embodiment of the invention.

Referring now to FIG. 1, tuned circuit 10 is shown comprising the electrical series combination of inductor 11 and capacitor 12. The tuned circuit includes first and second terminals 13 and 14 respectively. The second terminal 14 of tuned circuit 10 is coupled to input terminal 15 of limiting amplifier 17.

The limiting amplifier 17 includes transistor 20, diode 21 and resistor 22. As shown, the emitter and base electrodes of transistor 20 are coupled to ground and to input terminal 15 respectively. When transistor 20 is rendered conductive, its base-emitter junction is in electrical series with the tuned circuit and provides a low impedance path to ground. In addition, terminal 15 of limiting amplifier 17 is coupled to ground through diode 21. Diode 21 is poled to provide a low impedance path to ground when transistor 20 is nonconductive, i.e. when transistor 20 is driven into conduction by the negative half-cycle of the tuned circuit current, diode 21 is poled to pass the positive half-cycle to ground. The collector of transistor 20 is coupled through resistor 22 to supply voltage source —V. Consequently, as transistor 20 is driven into and out of conduction by the tuned circuit current, the voltage at output terminal 16 of the limiting amplifier varies from ground to a negative voltage approaching the magnitude of the supply voltage —V. The waveform of the voltage at terminal 16 is a square wave varying between two levels with the interval at each level being equal to one-half period of the frequency of oscillation of the tuned circuit. The sinusoidal form of the tuned circuit current insures that the output waveform of the limiting amplifier is symmetrical, i.e. the intervals at each voltage level are equal.

The output terminal 16 is coupled to first terminal 31 of variable timing circuit 30. The second terminal 32 of timing circuit 30 is coupled through inverter 40 to the tuned circuit 10. The variable timing circuit is operative to alter the symmetry of the output waveform of the limiting amplifier. In other words, the timing circuit is capable of changing the symmetry of the waveform by increasing the interval during which the waveform is at its second level. The period of the square wave is maintained the same though its symmetry has been changed.

A square wave may be considered as the summation of a number of frequency components. These components include a fundamental frequency component and the odd harmonics thereof. The symmetry of the square wave or the lack thereof is determined by the relative phases of these components. Altering the symmetry of a square wave changes the phase of its frequency components relative to the phase of the corresponding components in a symmetrical square wave. As mentioned previously, the output of the limiting amplifier is a symmetrical square wave having a period equal to the period of the tuned circuit current. Consequently, the fundamental frequency component of this symmetrical square wave is in phase with the tuned circuit current and when regeneratively fed back to the tuned circuit sustains the oscillations therein. By changing the symmetry of the square wave, the phase of the fundamental component is changed and the feedback signal is no longer in phase with the tuned circuit current.

Variable timing circuit 30 is capable of altering the symmetry of the limiting amplifier output waveform and therefore may be used to change the phase relationship between the feedback signal and the tuned circuit current. When such a phase difference is caused to exist, the frequency of oscillation of the tuned circuit changes. In the embodiment shown in FIG. 1, timing circuit 30 contains a monostable multivibrator in which the recovery time for the multivibrator is adjustable. The recovery time is the interval required for the multivibrator to return to its quiescent state after being triggered. The multivibrator 30 contains transistors 33 and 34 with their collector and base electrodes cross-coupled in the conventional manner. Transistor 34 is biased so as to be normally conductive and transistor 33 is biased so as to be cut-off. The application of a positive going transition to the base of transistor 34 renders it less conductive and the regeneration provided by the multivibrator circuit rapidly cuts it off and drives transistor 33 into saturation. Transistor 34 remains cut-off due to the charge on capacitor 36. The multivibrator returns to its quiescent state after a recovery time interval determined primarily by the time constant of variable resistor 35 and capacitor 36. The multivibrator remains in this state until a positive-going transition again triggers transistor 34 into cut-off.

In the multivibrator shown in FIG. 1, the output is taken from the collector of transistor 34 and applied to the base of transistor 37. The signal applied to the base of transistor 37 varies between ground and a negative voltage level. Transistor 37 is biased to be normally nonconductive by voltage source +V. The transistor is rendered conductive when the multivibrator is triggered and transistor 34 is cut-off. When transistor 37 is conductive, terminal 32 is maintained at ground. The interval during which terminal 32 is at ground is determined by the variable time constant of capacitor 36 and resistor 35. It shall be noted that the collector of transistor 37 is coupled to supply voltage source —V through the parallel combination of resistor 38 and capacitor 39 and through series resistor 22. Therefore, the voltage at terminal 32 is negative when transistor 37 is cut-off, i.e. when the multivibrator is in its quiescent state.

Second terminal 32 of timing circuit 30 is coupled to first terminal 41 of inverter 40. The second terminal 42 of the inverter is coupled to first terminal 13 of tuned circuit 10. In the embodiment shown, the feedback signal undergoes a 180 degree phase shift at the limiting amplifier and the inverter provides an additional 180 degree phase shift to complete the regenerative feedback path. The waveform of the voltage appearing at terminal 42 is a square wave which varies between ground and a negative voltage level. In the case where the tuned circuit is oscillating at its resonant frequency, the output of limiting amplifier is a symmetrical square wave and this symmetry is not altered by circuit 30, i.e. the multivibrator time constant is adjusted so that the output waveform at terminal 32 is symmetrical. Consequently, transistor 43 of inverter 40 is conductive for one-half the period of the resonant frequency oscillation. The negative voltage level at terminal 42 when transistor 43 is nonconductive is approximately twice the magnitude of the supply voltage source —V. This is due to the fact that terminal 42 is coupled to the supply voltage through shunt feed coil 44 and, therefore, the average voltage at terminal 42 is equal to the magnitude of voltage source —V. During operation, capacitor 45 is charged to about twice the magnitude of the supply voltage.

The combination of tuned circuit 10, limiting amplifier 17, inverter 40 and the feedback path between terminals 31 and 32 containing the parallel combination of resistor 38 and capacitor 39 constitute a fixed frequency sine wave oscillator. However, it is apparent that other limiting amplifiers and tuned circuit configurations may be employed in different embodiments of the invention. In addition, the variable timing circuit 30 need not contain a multivibrator. Alternatively, the timing circuit may include a variable delay line or another type variable duration pulse generator. Since the magnitude of the square wave signal at terminal 31 is not a factor in the variation of the frequency of oscillation of the tuned circuit, the gain characteristics of the circuit elements are essentially unrelated to the frequency stability of the circuit. The inverter circuit of the embodiment shown provides both the energy necessary to sustain the oscillations of the tuned circuit and a 180 degree phase shift for the feedback signal. However, the phase shift may be provided by other components in different embodiments of the invention.

Figure 2:
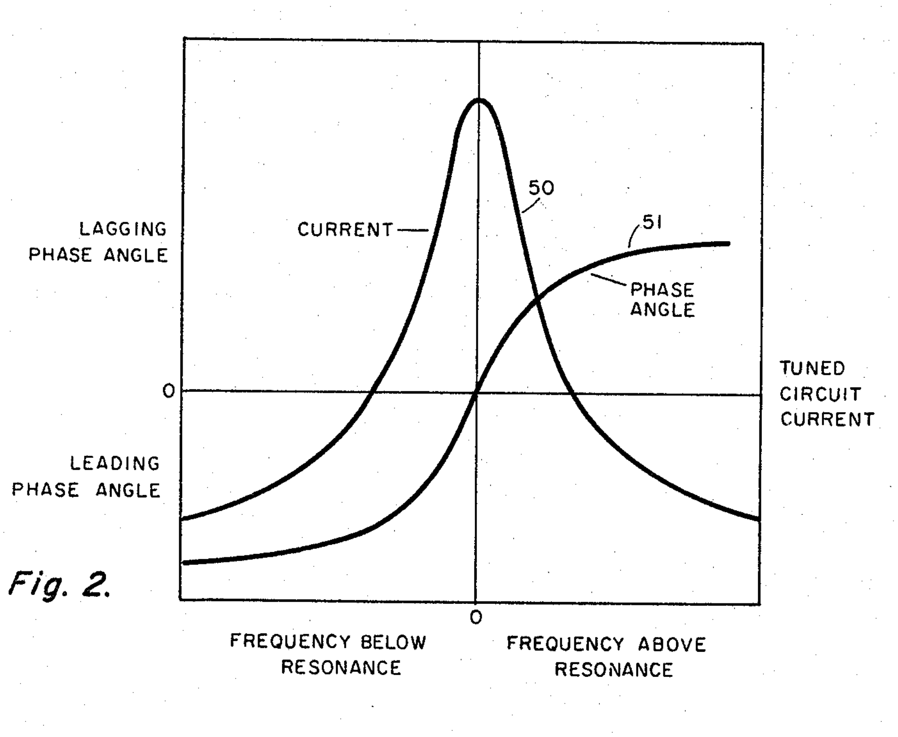
FIG. 2 is a graph showing the resonance curve for a series tuned circuit.

The graph of FIG. 2, generally referred to as the universal resonance curve, contains curve 50 showing the relationship between the tuned circuit current and the frequency of oscillation of the tuned circuit and curve 51 showing the relationship of the phase angle between the applied voltage and the tuned circuit current and the frequency of oscillation. It is seen from curve 51 that the frequency of oscillation of the tuned circuit can be made to differ from its resonant frequency by varying this phase angle.

Figure 3:
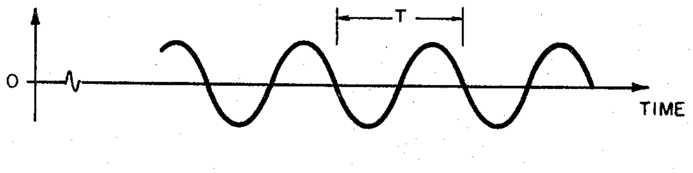
FIGS. 3, 4 and 5 are waveforms of signals produced at various points in the circuit of FIG. 1.
Figure 4:
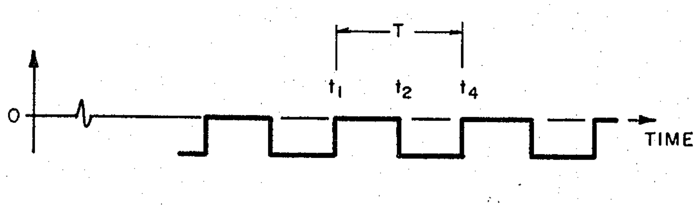

The operation of the circuit may be best described by assuming that the oscillator has been operating for a sufficient number of cycles so that initial starting transients have been eliminated. Under these conditions, tuned circuit 10 is oscillating at a particular frequency. The tuned current at terminal 14, shown in FIG. 3, is supplied to limiting amplifier 17 wherein it is translated into a symmetrical square wave and shifted in phase by 180 degrees relative to the tuned circuit current. The period of the square wave appearing at terminal 16, shown in FIG. 4, is equal to the period of the tuned circuit current.

The square wave output of the limiting amplifier is applied to terminal 31 of the variable timing circuit 30. Terminal 31 is coupled through DC blocking capacitor 29 to the base of transistor 34. Transistor 34 is included in a monostable multivibrator circuit and is normally conductive. The positive going transitions of the limiting amplifier output waveform render transistor 34 nonconductive, for example at time $t_1$, in FIG. 4.

Figure 5:
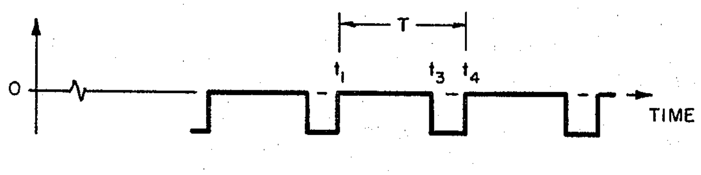

At time $t_1$, the multivibrator is in an unstable condition and the voltage at the collector of transistor 34 is negative thereby driving normally-off transistor 37 into conduction and coupling terminal 32 to ground. The voltage waveform at terminal 32 of timing circuit 30 is shown in FIG. 5. Transistor 37 is maintained in conduction until capacitor 36 discharges so that the multivibrator returns to its quiescent condition and transistor 34 is again conducting. The interval required for the multivibrator to return to its quiescent condition is determined primarily by the time constant of resistor 35 and capacitor 36. At the end of this interval, shown in FIG. 5 as time $t_3$, the transistor 37 is cut-off and the voltage at terminal 32 is negative. In this embodiment, resistor 35 may be varied to control the length of this interval. Increasing the magnitude of resistor 35 increases the interval $t_3$–$t_1$. As shown in FIG. 4 and 5, the next positive-going transition at time $t_4$ triggers the multivibrator and the voltage at terminal 32 is again at ground.

The voltage level at terminal 32 is determined by whether transistor 37 is conductive or is cut-off. While terminal 32 is coupled to supply voltage source —V through the limiting amplifier 17, the voltage at terminal 32 is not directly affected by the voltage output at terminal 16. This result is shown at time $t_2$ in FIG. 4. This manner of coupling the collector of transistor 37 to the supply voltage source provides an additional advantage during the circuit starting period. Initially, there is insufficient drive to trigger the multivibrator and the transistor 37 is cut-off. However, the output of the limiting amplifier is coupled through the parallel combination of resistor 38 and capacitor 39 to terminal 41. This provides sufficient regeneration to permit the circuit to rapidly reach its normal operating condition.

The increasing of the magnitude of resistor 35 delays the negative-going transition of the waveform at terminal 32. This transition is shown occurring at time $t_3$ in FIG. 5. Also, decreasing the magnitude of resistor 35 results in a decrease in the interval $t_3$–$t_1$. The variation in the symmetry of the square wave feedback signal produces a corresponding variation in the phase of the fundamental frequency component of the wave relative to the phase of the tuned circuit current.

The curve 51 of FIG. 2 shows the relationship of the frequency of oscillation of the tuned circuit to the phase angle of the applied voltage and the tuned circuit current. The present circuit provides a variable frequency oscillator in which the frequency variation is determined by the controlling of the symmetry of a square wave. Since one level of the square wave is at ground, the circuit in effect controls frequency by controlling the duration of a binary pulse. This duration control is accomplished by timing circuits so that the circuit is essentially insensitive to any variations in the gain of the active devices employed therein. The amount of frequency variation available in the present oscillator is determined primarily by the particular desired application since the tuned circuit current varies in accordance with curve 50 of FIG. 2 as the tuned circuit is operated off resonance. In one embodiment tested and operated with a tuned circuit having a resonant frequency of 212 kc., the frequency was varied to 202.5 kc. without unduly increasing the tuned circuit losses.

While the above description has referred to a specific embodiment of the invention, it will be recognized that many modifications and variations may be made therein without departing from the spirit and scope of the invention.

What is claimed is:

1. A variable frequency sine wave generator comprising:

(a) a series tuned circuit having first and second terminals, said circuit having a characteristic resonant frequency;

(b) a limiting amplifier having input and output terminals, said input terminal being coupled to the second terminal of said tuned circuit, the signal appearing at the output terminal of the limiting amplifier being a symmetrical square wave;

(c) a variable timing circuit having first and second terminals, said first terminal being coupled to the output terminal of said limiting amplifier, said timing circuit being capable of changing the symmetry of said square wave whereby the phase of the fundamental frequency component of the square wave is varied; and (d) means for coupling the second terminal of said timing circuit to the first terminal of said tuned circuit, the phase of said fundamental frequency component controlling the frequency of oscillation of said tuned circuit.

2. The sine wave generator of claim 1 in which said variable timing circuit comprises (a) a variable duration pulse generator having first and second states corresponding to first and second voltage levels respectively;

(b) means for coupling said pulse generator to the first terminal of said timing circuit, said pulse generator being triggered into its first state by the square wave signal from said limiting amplifier;

(c) means for varying the interval required for said pulse generator to return to its second state, and (d) means for coupling the output of said pulse generator to the second terminal of said timing circuit.

3. The sine wave generator of claim 2 in which said variable duration pulse generator comprises a monostable multivibrator.

4. The sine wave generator of claim 3 in which said multivibrator comprises first and second cross-coupled transistors having base, emitter and collector electrodes, the collector electrode of one transistor being capacitively cross-coupled to the base electrode of the other transistor, the base electrode of said other transistor being coupled to a voltage source having a polarity such that said other transistor is conductive in the second state, and in which said means for varying the interval comprises a variable resistor coupled between said capacitor and said voltage source.

5. The sine wave generator of claim 4 in which said means for coupling the second terminal of said timing circuit to the first terminal of said tuned circuit comprises an inverter circuit.

6. The sine wave generator of claim 5 in which said tuned circuit comprises an electrical series combination of a capacitor and an inductor.

7. The sine wave generator of claim 6 in which said means for coupling the multivibrator to the first terminal of said timing circuit is a blocking capacitor.

8. The sine wave generator of claim 7 in which said timing circuit further comprises an electrical parallel combination of a resistor and a capacitor coupled between the first and second terminals thereof.

No references cited.

JOHN KOMINSKI, *Acting Primary Examiner.*

ROY LAKE, *Examiner.*

S. GRIMM, *Assistant Examiner.*